United States Patent
Todd (10) Patent No.: US 8,921,205 B2
(45) Date of Patent: Dec. 30, 2014

(54) DEPOSITION OF AMORPHOUS SILICON-CONTAINING FILMS

(75) Inventor: Michael A. Todd, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 721 days.

(21) Appl. No.: 11/626,730

(22) Filed: Jan. 24, 2007

(65) Prior Publication Data

US 2007/0117359 A1 May 24, 2007

Related U.S. Application Data (62) Division of application No. 10/219,687, filed on Aug. 14, 2002, now Pat. No. 7,186,630.

(51) Int. Cl.
| | |
|---|---|
| *H01L 21/36* | (2006.01) |
| *C30B 29/06* | (2006.01) |
| *H01L 21/02* | (2006.01) |
| *C23C 16/32* | (2006.01) |
| *C30B 25/02* | (2006.01) |
| *C23C 16/24* | (2006.01) |

(52) U.S. Cl.
CPC ............ *C30B 29/06* (2013.01); *H01L 21/0262* (2013.01); *H01L 21/02378* (2013.01); *H01L 21/02532* (2013.01); *H01L 21/02381* (2013.01); *C23C 16/325* (2013.01); *C30B 25/02* (2013.01); *C23C 16/24* (2013.01); *H01L 21/02529* (2013.01)
USPC ............ 438/478; 438/481; 438/482; 438/486

(58) Field of Classification Search
CPC ........ C30B 29/06; C30B 25/02; C23C 16/24; H01L 21/02529; H01L 21/02532; H01L 21/02378; H01L 21/02381
USPC .......................... 438/166, 482, 486, 481, 478; 257/E21.131
See application file for complete search history.

(56) References Cited

U.S. PATENT DOCUMENTS

| | | | |
|---|---|---|---|
| 3,900,597 | A | 8/1975 | Chruma et al. |
| 4,058,430 | A | 11/1977 | Suntola et al. |
| 4,118,539 | A | 10/1978 | Hirai et al. |
| 4,200,666 | A | 4/1980 | Reinberg |
| 4,217,374 | A | 8/1980 | Ovshinsky et al. |
| 4,223,048 | A | 9/1980 | Engle |

(Continued)

FOREIGN PATENT DOCUMENTS

| | | |
|---|---|---|
| DE | 19820147 A1 | 7/1999 |
| EP | 0 233 613 A2 | 2/1987 |

(Continued)

OTHER PUBLICATIONS

Machine English Translation of JP-09-082651, Mar. 1997, Kanbayashi et al.*

(Continued)

*Primary Examiner* — Michael Trinh
(74) *Attorney, Agent, or Firm* — Knobbe, Martens, Olson & Bear, LLP (57) ABSTRACT

Chemical vapor deposition methods are used to deposit amorphous silicon-containing films over various substrates. Such methods are useful in semiconductor manufacturing to provide a variety of advantages, including uniform deposition over heterogeneous surfaces, high deposition rates, and higher manufacturing productivity. Preferably, the deposited amorphous silicon-containing film is annealed to produce crystalline regions over all or part of an underlying substrate.

25 Claims, 5 Drawing Sheets

(56) References Cited

U.S. PATENT DOCUMENTS

| | | | |
|---|---|---|---|
| 4,237,150 A | 12/1980 | Wiesmann | |
| 4,363,828 A | 12/1982 | Brodsky et al. | |
| 4,379,020 A | 4/1983 | Glaeser et al. | |
| 4,413,022 A | 11/1983 | Suntola et al. | |
| 4,444,812 A | 4/1984 | Gutsche | |
| 4,452,875 A | 6/1984 | Ogawa et al. | |
| 4,481,229 A | 11/1984 | Suzuki et al. | |
| 4,495,218 A | 1/1985 | Azuma et al. | |
| 4,557,794 A | 12/1985 | McGinn et al. | |
| 4,578,142 A | 3/1986 | Corboy, Jr. et al. | |
| 4,585,671 A | 4/1986 | Kitagawa et al. | |
| 4,592,933 A | 6/1986 | Meyerson et al. | |
| 4,615,762 A | 10/1986 | Jastrzebski et al. | |
| 4,631,804 A | 12/1986 | Roy | |
| 4,634,605 A | 1/1987 | Wiesmann | |
| 4,684,542 A | 8/1987 | Jasinski et al. | |
| 4,695,331 A | 9/1987 | Ramaprasad | |
| 4,704,186 A | 11/1987 | Jastrzebski | |
| 4,707,197 A | 11/1987 | Hensel et al. | |
| 4,720,395 A | 1/1988 | Foster | |
| 4,737,379 A | 4/1988 | Hudgens et al. | |
| 4,745,088 A | 5/1988 | Inoue et al. | |
| 4,747,367 A | 5/1988 | Posa | |
| 4,755,481 A | 7/1988 | Faraone | |
| 4,761,269 A | 8/1988 | Conger et al. | |
| 4,854,263 A | 8/1989 | Chang et al. | |
| 4,871,416 A | 10/1989 | Fukuda | |
| 4,891,092 A | 1/1990 | Jastrzebski | |
| 4,894,352 A | 1/1990 | Lane et al. | |
| 4,902,645 A | 2/1990 | Ohba | |
| 4,927,786 A * | 5/1990 | Nishida | 438/488 |
| 4,933,206 A | 6/1990 | Cox | |
| 4,963,506 A | 10/1990 | Liaw et al. | |
| 4,966,861 A | 10/1990 | Mieno et al. | |
| 4,992,299 A | 2/1991 | Hochberg et al. | |
| 5,037,666 A | 8/1991 | Mori | |
| 5,068,124 A | 11/1991 | Batey et al. | |
| 5,071,670 A | 12/1991 | Kelly | |
| 5,080,933 A | 1/1992 | Grupen-Shemansky et al. | |
| 5,082,696 A | 1/1992 | Sharp | |
| 5,091,761 A | 2/1992 | Hiraiwa et al. | |
| 5,110,757 A | 5/1992 | Arst et al. | |
| 5,112,773 A | 5/1992 | Tuttle | |
| 5,192,714 A | 3/1993 | Suguro et al. | |
| 5,194,398 A | 3/1993 | Miyachi et al. | |
| 5,198,387 A | 3/1993 | Tang | |
| 5,214,002 A | 5/1993 | Hayashi et al. | |
| 5,227,329 A | 7/1993 | Kobayashi et al. | |
| 5,231,056 A | 7/1993 | Sandhu | |
| 5,234,609 A | 8/1993 | Kashida et al. | |
| 5,242,847 A | 9/1993 | Ozturk et al. | |
| 5,250,452 A | 10/1993 | Ozturk et al. | |
| 5,306,666 A | 4/1994 | Izumi | |
| 5,324,684 A | 6/1994 | Kermani et al. | |
| 5,326,649 A | 7/1994 | Kashida et al. | |
| 5,356,821 A | 10/1994 | Naruse et al. | |
| 5,385,863 A | 1/1995 | Tatsumi et al. | |
| 5,389,398 A | 2/1995 | Suzuki et al. | |
| 5,389,570 A | 2/1995 | Shiozawa | |
| 5,453,858 A | 9/1995 | Yamazaki | |
| 5,461,250 A | 10/1995 | Burghartz et al. | |
| 5,471,330 A | 11/1995 | Sarma | |
| 5,504,704 A | 4/1996 | Sato et al. | |
| 5,508,067 A | 4/1996 | Sato et al. | |
| 5,510,146 A | 4/1996 | Miyasaka | |
| 5,540,785 A | 7/1996 | Dennard et al. | |
| 5,563,093 A | 10/1996 | Koda et al. | |
| 5,582,640 A | 12/1996 | Okada et al. | |
| 5,587,344 A | 12/1996 | Ishikawa | |
| 5,591,494 A | 1/1997 | Sato et al. | |
| 5,607,724 A | 3/1997 | Beinglass et al. | |
| 5,614,257 A | 3/1997 | Beinglass et al. | |
| 5,616,754 A | 4/1997 | Cruse et al. | |
| 5,648,293 A | 7/1997 | Hayama et al. | |
| 5,654,237 A | 8/1997 | Suguro et al. | |
| 5,656,531 A | 8/1997 | Thakur et al. | |
| 5,674,781 A | 10/1997 | Huang et al. | |
| 5,677,236 A | 10/1997 | Saitoh et al. | |
| 5,695,819 A | 12/1997 | Beinglass et al. | |
| 5,698,771 A | 12/1997 | Shields et al. | |
| 5,700,520 A | 12/1997 | Beinglass et al. | |
| 5,711,811 A | 1/1998 | Suntola et al. | |
| 5,731,238 A | 3/1998 | Cavins et al. | |
| 5,763,021 A | 6/1998 | Young et al. | |
| 5,769,950 A | 6/1998 | Takasu et al. | |
| 5,786,027 A | 7/1998 | Rolfson | |
| 5,789,030 A | 8/1998 | Rolfson | |
| 5,831,335 A | 11/1998 | Miyamoto | |
| 5,837,580 A | 11/1998 | Thakur et al. | |
| 5,849,601 A | 12/1998 | Yamazaki | |
| 5,858,819 A | 1/1999 | Miyasaka | |
| 5,863,598 A | 1/1999 | Venkatesan et al. | |
| 5,869,389 A | 2/1999 | Ping et al. | |
| 5,874,129 A | 2/1999 | Beinglass et al. | |
| 5,876,797 A | 3/1999 | Beinglass et al. | |
| 5,879,459 A | 3/1999 | Gadgil et al. | |
| 5,879,970 A | 3/1999 | Shiota et al. | |
| 5,885,869 A | 3/1999 | Turner et al. | |
| 5,893,949 A | 4/1999 | King et al. | |
| 5,904,565 A | 5/1999 | Nguyen et al. | |
| 5,916,365 A | 6/1999 | Sherman | |
| 5,930,106 A | 7/1999 | Deboer et al. | |
| 5,933,761 A | 8/1999 | Lee | |
| 5,959,326 A | 9/1999 | Aiso et al. | |
| 5,969,393 A * | 10/1999 | Noguchi | 257/396 |
| 5,998,289 A | 12/1999 | Sagnes | |
| 6,013,922 A | 1/2000 | Ueda et al. | |
| 6,027,705 A | 2/2000 | Kitsuno et al. | |
| 6,027,975 A | 2/2000 | Hergenrother et al. | |
| 6,037,258 A | 3/2000 | Liu et al. | |
| 6,042,654 A | 3/2000 | Comita et al. | |
| 6,048,790 A | 4/2000 | Iacoponi et al. | |
| 6,069,068 A | 5/2000 | Rathore et al. | |
| 6,077,775 A | 6/2000 | Stumborg et al. | |
| 6,083,810 A | 7/2000 | Obeng et al. | |
| 6,083,818 A | 7/2000 | Stumborg et al. | |
| 6,090,666 A | 7/2000 | Ueda et al. | |
| 6,091,117 A * | 7/2000 | Shiozawa et al. | 257/384 |
| 6,093,368 A | 7/2000 | Rafferty et al. | |
| 6,100,184 A | 8/2000 | Zhao et al. | |
| 6,103,600 A | 8/2000 | Ueda et al. | |
| 6,107,147 A | 8/2000 | Kim et al. | |
| 6,121,081 A | 9/2000 | Thakur et al. | |
| 6,139,700 A | 10/2000 | Kang et al. | |
| 6,146,517 A | 11/2000 | Hoinkis | |
| 6,147,375 A * | 11/2000 | Yamazaki et al. | 257/296 |
| 6,150,283 A | 11/2000 | Ishiguro | |
| 6,153,541 A | 11/2000 | Yao et al. | |
| 6,159,828 A | 12/2000 | Ping et al. | |
| 6,161,498 A | 12/2000 | Toraguchi et al. | |
| 6,162,667 A | 12/2000 | Funai et al. | |
| 6,171,662 B1 | 1/2001 | Nakao | |
| 6,181,012 B1 | 1/2001 | Edelstein et al. | |
| 6,184,128 B1 | 2/2001 | Wang et al. | |
| 6,188,134 B1 | 2/2001 | Stumborg et al. | |
| 6,197,669 B1 | 3/2001 | Twu et al. | |
| 6,197,694 B1 | 3/2001 | Beinglass | |
| 6,200,893 B1 | 3/2001 | Sneh | |
| 6,203,613 B1 | 3/2001 | Gates et al. | |
| 6,207,487 B1 | 3/2001 | Kim et al. | |
| 6,207,567 B1 | 3/2001 | Wang et al. | |
| 6,210,988 B1 | 4/2001 | Howe et al. | |
| 6,225,213 B1 | 5/2001 | Urabe | |
| 6,228,181 B1 | 5/2001 | Yamamoto et al. | |
| 6,235,568 B1 | 5/2001 | Murthy et al. | |
| 6,252,284 B1 | 6/2001 | Muller et al. | |
| 6,252,295 B1 | 6/2001 | Cote et al. | |
| 6,270,572 B1 | 8/2001 | Kim et al. | |
| 6,274,463 B1 | 8/2001 | Chaiken | |
| 6,281,559 B1 | 8/2001 | Yu et al. | |
| 6,284,583 B1 | 9/2001 | Saido et al. | |
| 6,287,965 B1 | 9/2001 | Kang et al. | |
| 6,291,876 B1 | 9/2001 | Stumborg et al. | |
| 6,303,523 B2 | 10/2001 | Cheung et al. | |

(56) References Cited

U.S. PATENT DOCUMENTS

| | | | |
|---|---|---|---|
| 6,319,782 | B1 | 11/2001 | Nakabayashi et al. |
| 6,326,064 | B1 | 12/2001 | Denison et al. |
| 6,326,311 | B1 | 12/2001 | Ueda et al. |
| 6,340,619 | B1 | 1/2002 | Ko |
| 6,342,448 | B1 | 1/2002 | Lin et al. |
| 6,346,732 | B1 * | 2/2002 | Mizushima et al. .......... 257/382 |
| 6,351,039 | B1 | 2/2002 | Jin et al. |
| 6,358,829 | B2 | 3/2002 | Yoon et al. |
| 6,365,465 | B1 | 4/2002 | Chan et al. |
| 6,365,479 | B1 | 4/2002 | U'Ren |
| 6,368,954 | B1 | 4/2002 | Lopatin et al. |
| 6,372,559 | B1 | 4/2002 | Crowder et al. |
| 6,373,112 | B1 | 4/2002 | Murthy et al. |
| 6,380,065 | B1 | 4/2002 | Komai et al. |
| 6,385,020 | B1 | 5/2002 | Shin et al. |
| 6,391,785 | B1 | 5/2002 | Satta et al. |
| 6,444,495 | B1 | 9/2002 | Leung et al. |
| 6,444,512 | B1 | 9/2002 | Madhukar et al. |
| 6,455,892 | B1 | 9/2002 | Okuno et al. |
| 6,465,045 | B1 | 10/2002 | Heuer et al. |
| 6,482,733 | B2 | 11/2002 | Raaijmakers et al. |
| 6,555,839 | B2 | 4/2003 | Fitzgerald |
| 6,583,015 | B2 | 6/2003 | Fitzgerald et al. |
| 6,583,048 | B1 | 6/2003 | Vincent et al. |
| 6,593,191 | B2 | 7/2003 | Fitzgerald |
| 6,610,361 | B1 | 8/2003 | Heuer et al. |
| 6,613,695 | B2 | 9/2003 | Pomarede et al. |
| 6,709,512 | B2 | 3/2004 | Yamoto et al. |
| 6,716,713 | B2 | 4/2004 | Todd |
| 6,716,751 | B2 | 4/2004 | Todd |
| 6,727,169 | B1 | 4/2004 | Raajimakers et al. |
| 6,743,738 | B2 | 6/2004 | Todd |
| 6,821,825 | B2 | 11/2004 | Todd et al. |
| 6,835,675 | B2 * | 12/2004 | Yamazaki et al. ............ 438/795 |
| 6,900,115 | B2 | 5/2005 | Todd |
| 6,958,253 | B2 | 10/2005 | Todd |
| 6,962,859 | B2 | 11/2005 | Todd et al. |
| 6,969,875 | B2 | 11/2005 | Fitzgerald |
| 7,005,160 | B2 | 2/2006 | Todd |
| 7,026,219 | B2 | 4/2006 | Pomarede et al. |
| 7,186,582 | B2 | 3/2007 | Todd |
| 7,186,630 | B2 | 3/2007 | Todd |
| 7,273,799 | B2 | 9/2007 | Todd |
| 7,285,500 | B2 | 10/2007 | Todd |
| 2001/0001742 | A1 | 5/2001 | Huang et al. |
| 2001/0034123 | A1 | 10/2001 | Jeon et al. |
| 2002/0011612 | A1 | 1/2002 | Hieda |
| 2002/0016084 | A1 | 2/2002 | Todd |
| 2002/0023520 | A1 | 2/2002 | Hu |
| 2002/0036290 | A1 | 3/2002 | Inaba et al. |
| 2002/0098627 | A1 | 7/2002 | Pomarede et al. |
| 2002/0168868 | A1 | 11/2002 | Todd |
| 2002/0173130 | A1 | 11/2002 | Pomerede et al. |
| 2003/0047129 | A1 | 3/2003 | Kawahara |
| 2004/0224089 | A1 | 11/2004 | Singh et al. |
| 2004/0262694 | A1 | 12/2004 | Chidambaram |
| 2005/0023520 | A1 | 2/2005 | Lee et al. |
| 2005/0064684 | A1 | 3/2005 | Todd et al. |
| 2005/0079692 | A1 | 4/2005 | Samoilov et al. |
| 2005/0233529 | A1 | 10/2005 | Pomerede et al. |
| 2005/0250298 | A1 | 11/2005 | Bauer |
| 2006/0011984 | A1 | 1/2006 | Currie |
| 2006/0014366 | A1 | 1/2006 | Currie |
| 2006/0115933 | A1 | 6/2006 | Ye et al. |
| 2006/0130743 | A1 | 6/2006 | Brabant et al. |
| 2006/0148151 | A1 | 7/2006 | Murthy et al. |
| 2006/0166414 | A1 | 7/2006 | Carlson et al. |
| 2006/0169668 | A1 | 8/2006 | Samoilov |
| 2006/0169669 | A1 | 8/2006 | Zojaji et al. |
| 2006/0205194 | A1 | 9/2006 | Bauer |
| 2006/0234504 | A1 | 10/2006 | Bauer et al. |
| 2006/0240630 | A1 | 10/2006 | Bauer et al. |
| 2006/0289900 | A1 | 12/2006 | Thirupapuliyur et al. |
| 2007/0102790 | A1 | 5/2007 | Todd |
| 2007/0117359 | A1 | 5/2007 | Todd |
| 2007/0161316 | A1 | 7/2007 | Taguchi et al. |
| 2007/0287272 | A1 | 12/2007 | Bauer et al. |
| 2008/0014725 | A1 | 1/2008 | Todd |
| 2008/0026149 | A1 | 1/2008 | Tomasini et al. |
| 2008/0073645 | A1 | 3/2008 | Todd et al. |

FOREIGN PATENT DOCUMENTS

| | | |
|---|---|---|
| EP | 0 388 651 A2 | 5/1990 |
| EP | 0 486 047 A2 | 11/1991 |
| EP | 0 747 974 A2 | 12/1996 |
| EP | 1 065 728 A2 | 1/2001 |
| GB | 2332564 A | 6/1999 |
| JP | 49-121488 | 11/1974 |
| JP | 57209810 A | 12/1982 |
| JP | 59078918 A | 5/1984 |
| JP | 59078919 A | 5/1984 |
| JP | 1985-015967 | 1/1985 |
| JP | 60043485 A | 3/1985 |
| JP | S60-43485 | 3/1985 |
| JP | 60257703 | 11/1985 |
| JP | 61095535 | 5/1986 |
| JP | 61153277 A | 7/1986 |
| JP | 1986-194823 | 8/1986 |
| JP | 62076612 A | 4/1987 |
| JP | 1987-253771 | 11/1987 |
| JP | 63003414 A | 1/1988 |
| JP | 63003463 A | 1/1988 |
| JP | 1988-051680 | 3/1988 |
| JP | 63166502 | 7/1988 |
| JP | 01-128428 | 5/1989 |
| JP | 01217956 A | 8/1989 |
| JP | 01268064 A | 10/1989 |
| JP | 1990-000314 | 1/1990 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 1991-205830 | 9/1991 |
| JP | 03292741 A | 12/1991 |
| JP | 1992-085818 | 3/1992 |
| JP | 04323834 A | 11/1992 |
| JP | 05021378 A | 1/1993 |
| JP | 05062911 A | 3/1993 |
| JP | H5-62911 | 3/1993 |
| JP | 05-129202 | 5/1993 |
| JP | 1993-275335 | 10/1993 |
| JP | 1993-275679 | 10/1993 |
| JP | 1993-087171 | 12/1993 |
| JP | 06-021494 | 1/1994 |
| JP | 1994-013313 | 1/1994 |
| JP | 1994-204138 | 7/1994 |
| JP | 1994-302526 | 10/1994 |
| JP | 1994-310493 | 11/1994 |
| JP | 1994-338497 | 12/1994 |
| JP | 1995-006952 | 1/1995 |
| JP | 1995-037823 | 2/1995 |
| JP | 5389570 | 2/1995 |
| JP | 1995-131007 | 5/1995 |
| JP | 07-249618 | 9/1995 |
| JP | 5453858 | 9/1995 |
| JP | 07249618 A | 9/1995 |
| JP | 08-045838 | 2/1996 |
| JP | 08-139032 | 5/1996 |
| JP | 1996-148427 | 6/1996 |
| JP | 08242006 A | 9/1996 |
| JP | 08-279462 | 10/1996 |
| JP | 1996-298333 | 11/1996 |
| JP | 1996-306688 | 11/1996 |
| JP | 09-082651 | * 3/1997 |
| JP | 1997-153633 | 6/1997 |
| JP | 1997-191117 | 7/1997 |
| JP | 1997-260293 | 10/1997 |
| JP | 10-055971 | 2/1998 |
| JP | 1998-041321 | 2/1998 |

(56) References Cited

FOREIGN PATENT DOCUMENTS

| | | |
|---|---|---|
| JP | 10-223913 | 8/1998 |
| JP | 1998-203895 | 8/1998 |
| JP | 1998-308503 | 11/1998 |
| JP | 1998-321860 | 12/1998 |
| JP | 1999-087341 | 3/1999 |
| JP | 1999-238809 | 8/1999 |
| JP | 1999-256328 | 9/1999 |
| JP | 1999-317530 | 11/1999 |
| JP | 1999-326958 | 11/1999 |
| JP | 2000-068519 | 3/2000 |
| JP | 2000-077658 | 3/2000 |
| JP | 2000-232219 | 8/2000 |
| JP | 2000-299470 | 10/2000 |
| JP | 2000-323420 | 11/2000 |
| JP | 2000-340512 | 12/2000 |
| JP | 2000-340684 | 12/2000 |
| JP | 2001-007301 | 1/2001 |
| JP | 2001-015736 | 1/2001 |
| KR | 10-0209856 | 10/1991 |
| KR | 1994-4441 | 5/1994 |
| KR | 1999-81566 | 11/1996 |
| KR | 1998-081556 | 11/1998 |
| KR | 1999-029923 | 4/1999 |
| KR | 1999-78392 | 10/1999 |
| KR | 2001-004563 | 1/2001 |
| WO | WO 96/17107 | 6/1996 |
| WO | WO 00/03425 | 7/1999 |
| WO | WO 99/35311 | 7/1999 |
| WO | WO 99/41423 | 8/1999 |
| WO | WO 99/62109 | 12/1999 |
| WO | WO 00/03061 | 1/2000 |
| WO | WO 00/11721 | 3/2000 |
| WO | WO 00/13207 | 3/2000 |
| WO | WO 00/13227 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 | 12/2000 |
| WO | WO 00/79576 | 12/2000 |
| WO | WO 01/15220 | 3/2001 |
| WO | WO 01/36702 | 5/2001 |
| WO | WO 01/45149 | 6/2001 |
| WO | WO 01/66832 | 9/2001 |
| WO | WO 01/78123 | 10/2001 |
| WO | WO 01/78124 | 10/2001 |
| WO | WO 01/99166 | 12/2001 |
| WO | WO 02/064853 A2 | 8/2002 |
| WO | WO 02/065517 | 8/2002 |
| WO | WO 02/065525 | 8/2002 |
| WO | WO 02/085508 | 8/2002 |
| WO | WO 02/085516 | 8/2002 |
| WO | WO 02/080244 | 10/2002 |

OTHER PUBLICATIONS

Edwards, C., "Submicron zone catalyst for end of bulk CMOS," EETimes, May 12, 2001, 2 pages.
Hergenrother, J.M., "The Vertical Replaement-Gate (VRG) MOFSET: A 50-nm Vertical MOFSET with Lithography-Independent Gate Length," IEDM Technical Digest, 1999, 4 pages.
Huang, X. et al., "Sub 50-nm FinFET: PMOS," IEDM Technical Digest, 1999, 5 pages.
Van Zant, Peter, "Microchip Fabrication," $4^{th}$ Ed., McGraw Hill, New York, (2000), pp. 364-365.
Van Zant, Peter, "Microchip Fabrication," $4^{th}$ Ed., McGraw Hill, New York, (2000), p. 380-382.
Wong, H.S., "Beyond the Conventional Transistor," IBM J. Res. & Dev., vol. 46, No. 2/3, Mar./May 2002, pp. 133-168.
International Search Report Issued by the PCT on Mar. 3, 2004, 4 pages.
EPO Office Action for App. 02 757 761.8-1528 mailed Feb. 27, 2009.
Japan Office Action for 2004-529111 mailed Jul. 29, 2009.
Colter, Tina J. et al., "High Quality Plasma-Enhanced Chemical Vapor Deposited Silicon Nitride Films," Journal of the Electrochemical Society, vol. 140, No. 7, Jul. 1993, pp. 2071-2075.
Wolf, S. and Tauber, R., "Silicon Processing for the VLSI Era," vol. 1, Lattice Press, Sunset Beach, CA, (2000), pp. 225-264.
Khanh, N.Q. et al., "Ion beam analysis of plasma immersion implanted silicon for solar cell fabrication," Nuclear Instruments and Methods in Physics Research, Sec. B. vol. 112, May 1, 1996, pp. 259-262.
Comfort, J.H. et al., "Plasma-enhanced chemical vapor deposition of in situ doped epitaxial silicon at low temperatures II boron doping," Journal of Applied Physics, vol. 65, No. 3, Feb. 1, 1989, pp. 1067-1073.
Bensahel et al., "Industrial single wafer processing of in-situ doped polycrsyalline Si and Si1-xGex," Solid State Technology, Mar. 1998, pp. S5-S10.
Ikoma et al., "Growth of Si/3C—SiC/Si(100) heterostructures by pulsed supersonic free jets," Applied Physics Letters, vol. 75, No. 25, pp. 3977-3979, Dec. 1999.
Japanese Office Action dated Jun. 15, 2010 in Japanese Patent Application No. 2002-578556 with English translation.
English translation of Japanese Notice of Reasons for Rejected dated Jun. 5, 2012 in Japanese Patent Application No. 2004-529111, 7 pages.

* cited by examiner

DEPOSITION OF AMORPHOUS SILICON-CONTAINING FILMS

RELATED APPLICATION INFORMATION

This application is a divisional of U.S. patent application Ser. No. 10/219,687, filed on Aug. 14, 2002, and issued as U.S. Pat. No. 7,186,630, which is hereby incorporated by reference in its entirety.

BACKGROUND OF THE INVENTION

1. Field of the Invention

This application relates generally to the deposition of silicon-containing materials. More particularly, this application relates to the deposition of amorphous silicon-containing films using trisilane, and to the annealing of such films to form crystalline silicon-containing films over a variety of substrates, including mixed substrates. Such deposition processes are useful in a variety of applications, e.g., semiconductor manufacturing.

2. Description of the Related Art

A variety of methods are used in the semiconductor manufacturing industry to deposit materials onto surfaces. For example, one of the most widely used methods is chemical vapor deposition ("CVD"), in which atoms or molecules contained in a vapor deposit on a surface and build up to form a film. Deposition of silicon-containing ("Si-containing") materials using conventional silicon sources and deposition methods is believed to proceed in several distinct stages, see Peter Van Zant, "Microchip Fabrication," 4$^{th}$ Ed., McGraw Hill, New York, (2000), pp. 364-365. Nucleation, the first stage, is very important and is greatly affected by the nature and quality of the substrate surface. Nucleation occurs as the first few atoms or molecules deposit onto the surface and form nuclei. During the second stage, the isolated nuclei form small islands that grow into larger islands. In the third stage, the growing islands begin coalescing into a continuous film. At this point, the film typically has a thickness of a few hundred angstroms and is known as a "transition" film. It generally has chemical and physical properties that are different from the thicker bulk film that begins to grow after the transition film is formed.

Deposition processes are usually designed to produce a particular type of bulk film morphology, e.g., single crystal, epitaxial, polycrystalline or amorphous. When using conventional silicon sources and deposition processes, nucleation is very important and critically dependent on substrate quality. For example, attempting to grow a single-crystal film on a wafer with islands of unremoved oxide will result in regions of polysilicon in the bulk film. Because of these nucleation issues, deposition of thin film Si-containing materials with similar physical properties onto substrates having two or more different types of surfaces using conventional silicon sources and deposition methods is often problematic.

For example, silicon tetrachloride ($SiCl_4$), silane ($SiH_4$) and dichlorosilane ($SiH_2Cl_2$) are the most widely used silicon sources in the semiconductor manufacturing industry for depositing Si-containing films, see Peter Van Zant, "Microchip Fabrication," 4$^{th}$ Ed., McGraw Hill, New York, (2000), p 380-382. However, deposition using these conventional silicon sources is generally difficult to control over mixed substrates, such as surfaces containing both single crystal silicon and silicon dioxide. Control is difficult because the morphology and thickness of the resulting Si-containing film depend on both the deposition temperature and the morphology of the underlying substrate. For example, U.S. Pat. No. 4,578,142 discloses that the deposition of single crystal silicon onto a single crystal surface using $SiH_2Cl_2$ begins immediately, whereas there is a delay before non-single-crystalline deposition occurs on an adjoining silicon dioxide surface. Other deposition parameters, including total reactor pressure, reactant partial pressure and reactant flow rate can also strongly influence the quality of depositions over mixed substrates.

U.S. Pat. No. 4,578,142 discloses the use of a two stage silicon deposition/etching cycle that involves depositing single crystal silicon onto a single crystal surface and selectively etching to remove any non-single crystalline material, then repeating the cycle until the deposited single crystal silicon grows laterally across an adjoining silicon dioxide surface. Later patents refer to this deposition process as "epitaxial lateral overgrowth" ("ELO"), see U.S. Pat. Nos. 4,615,762; 4,704,186; and 4,891,092. Similar ELO techniques are disclosed in U.S. Pat. Nos. 4,557,794 and 4,755,481. Although ELO provides a method for depositing single crystal silicon over portions of an adjoining non-single crystalline surface, the ability to extend the single crystal over large areas is limited.

Solid phase epitaxy ("SPE") is the solid phase transformation of an amorphous Si-containing material to single crystal Si-containing material, see U.S. Pat. Nos. 4,509,990; 4,808,546; 4,975,387; and 5,278,903. SPE has been used to selectively form single crystalline silicon over semiconductor substrates. For example, U.S. Pat. No. 6,346,732 discloses depositing an amorphous silicon film over a mixed substrate having a semiconductor surface and a silicon nitride surface by low pressure chemical vapor deposition ("LPCVD") using silane as a deposition gas, then transforming the portion of the amorphous film over the semiconductor surface to single crystalline silicon by annealing. U.S. Pat. No. 6,346,732 discloses that the portion of the amorphous silicon film over the silicon nitride surface remained amorphous after annealing, see column 18, lines 47-58.

JP Patent Application No. 63166502 discloses depositing an amorphous silicon film over a mixed substrate having a single crystal silicon surface and a silicon dioxide surface by LPCVD using silane as a deposition gas, then transforming the amorphous film over both of the underlying surfaces to single crystalline silicon by annealing. This process apparently proceeds by a lateral overgrowth mechanism, in which the annealing initiates crystallization of the amorphous film in the portion of the amorphous film over the single crystal silicon surface. The portion of the amorphous silicon layer overlying the non-single crystal surface and adjoining the newly crystallized region is then transformed into single-crystal silicon by lateral overgrowth, see JP Application No. 60257703 and U.S. Pat. No. 6,274,463. Crystallization of amorphous silicon to form polycrystalline silicon can be initiated by the introduction of catalyst elements, see U.S. Pat. No. 6,162,667.

Scaling conventional CMOS transistors much below 50 nm is difficult, see S. Tang et al., "FinFET—A Quasi-Planar Double-Gate MOFSET," IEEE International Solid-State Circuits Conference, Feb. 6, 2001 ("Tang"). Tang states that control of leakage currents requires gate dielectrics so thin and bodies doped so heavily that a process window sufficiently large for manufacturing might not be found. Double-gate MOSFET structures can overcome these and other limitations to transistor scaling. By placing a second gate on the opposite side of the device, the gate capacitance to the channel is doubled and the channel potential is better controlled by the gate electrode, thus limiting the current leakage. Various double gate structures have been proposed as well as methods for fabricating such structures. See, e.g., X. Huang et al., "Sub 50-nm FinFET: PMOS," IEDM Technical Digest, 1999; J. M Hergenrother, "The Vertical Replaement-Gate (VRG) MOF-SET: A 50-nm Vertical MOFSET with Lithography-Independent Gate Length," IEDM Technical Digest, 1999; J. Moers et al., "Vertical Double-Gate MOSFET based on Epitaxial Growth by LPCVD," U.S. Pat. No. 6,252,284; and U.S. Patent Application Publication Nos. 2002/0011612 and 2002/0036290.

However, the fabrication of double gate field effect transistors ("FET") is difficult, see H.-S Wong, "Beyond the Conventional MOFSET," IEDM Technical Digest, and/or involves complicated processing steps, see U.S. Pat. Nos. 6,372,559 and 6,365,465. It has been noted that putting a gate underneath the channel is prohibitively expensive using current techniques, see C. Edwards, "Submicron zone catalyst for end of bulk CMOS," EETimes, May 12, 2001. In many cases, the fabrication complexity can be traced to the multiple masking, deposition, etching, and planarization steps used to create various structures over assorted underlying surfaces, particularly those having mixed morphologies.

SUMMARY OF THE INVENTION

A preferred embodiment provides a deposition method comprising: providing a substrate disposed within a chamber, the substrate comprising a first surface having a first surface morphology and a second surface having a second surface morphology different from the first surface morphology; introducing trisilane to the chamber under chemical vapor deposition conditions; and depositing an amorphous Si-containing film onto the substrate over both of the first surface and the second surface.

Another preferred embodiment provides a deposition method comprising: depositing an amorphous Si-containing film onto a substrate using a feed gas that comprises trisilane; and annealing the amorphous Si-containing film to form a crystalline Si-containing film.

These and other aspects of the invention will be better understood in view of the preferred embodiments, described in greater detail below.

BRIEF DESCRIPTION OF THE DRAWINGS

These and other aspects of the invention will be readily apparent from the following description and from the appended drawings, which are meant to illustrate and not to limit the invention, and in which:

FIG. 1A illustrates a film deposited using silane under deposition conditions resulting in the formation of a single crystal film over the single crystal portion of the mixed substrate. FIG. 1B illustrates a film deposited using silane under conditions resulting in the formation of an amorphous film over a mixed substrate, followed by annealing to form a single crystalline film over the single crystalline portion of the mixed substrate.

DETAILED DESCRIPTION OF THE PREFERRED EMBODIMENT

Deposition processes have now been discovered that are much less sensitive to nucleation phenomena. These processes employ trisilane ($H_3SiSiH_2SiH_3$) as a silicon source to enable the deposition of high quality Si-containing films over various substrates, including mixed substrates. FIG. 1 illustrates the results obtained by typical prior art deposition processes using silane as the silicon source, whereas FIGS. 2-5 schematically illustrate preferred structures resulting from deposition using trisilane. FIGS. 2-5 show that the trisilane deposition methods described herein may be used to provide an amorphous Si-containing film that can be annealed to produce high quality single crystal and/or polycrystalline films over a variety of substrates, including mixed substrates. The preferred embodiments illustrated in FIGS. 2-5 are discussed in greater detail below.

As used herein, a "mixed substrate" is a substrate that has two or more different types of surfaces. There are various ways that surfaces can be different from each other. For example, the surfaces can be made from different elements such as copper or silicon, or from different metals, such as copper or aluminum, or from different Si-containing materials, such as silicon or silicon dioxide. Even if the materials are made from the same element, the surfaces can be different if the morphologies (crystallinity) of the surfaces are different. The electrical properties of surfaces can also make them different from each other. In the illustrated examples, Si-containing layers are simultaneously formed over conductive and semiconductive materials and dielectrics. Examples of dielectric materials include silicon dioxide, silicon nitride, metal oxide and metal silicate.

The processes described herein are useful for depositing Si-containing films on a variety of substrates, but are particularly useful for mixed substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material have long range order within each of the crystals, but the crystals themselves lack long range order with respect to one another. Single crystal morphology is a crystalline structure that has a high degree of order. Epitaxial films are characterized by a crystal structure and orientation that is identical to the substrate upon which they are grown. The atoms in these materials are arranged in a lattice-like structure that persists over relatively long distances (on an atomic scale), Amorphous morphology is a non-crystalline structure having a low degree of order because the atoms lack a definite periodic arrangement. Other morphologies include microcrystalline and mixtures of amorphous and crystalline material. As used herein, "single-crystal" or "epitaxial" is used to describe a predominantly large crystal structure that may have a tolerable number of faults therein. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. Specific examples of mixed substrates include without limitation single crystal/polycrystalline, single crystal/amorphous, epitaxial/polycrystalline, epitaxial/amorphous, single crystal/dielectric, epitaxial/dielectric, conductor/dielectric, and semiconductor/dielectric. The term "mixed substrate" includes substrates having more than two different types of surfaces, and thus the skilled artisan will understand that methods described herein for depositing Si-containing films onto mixed substrates having two types of surfaces may also be applied to mixed substrates having three or more different types of surfaces.

Under the CVD conditions taught herein, the delivery of trisilane to the surface of a substrate preferably results in the formation of an amorphous Si-containing film. Preferably, delivery of the trisilane to the substrate surface is accomplished by introducing the trisilane to a suitable chamber having the substrate disposed therein. By establishing CVD conditions in the chamber and supplying trisilane to the substrate surface, a high quality amorphous Si-containing film can be deposited onto the substrate over various surface types. Deposition may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing gaseous trisilane to deposit an amorphous Si-containing film onto a substrate contained within a CVD chamber. Thermal CVD is preferred.

Trisilane is preferably introduced to the chamber in the form of a gas or as a component of a feed gas. The total pressure in the CVD chamber is preferably in the range of about 0.001 Torr to about 1000 Torr, more preferably in the range of about 0.1 Torr to about 850 Torr, even more preferably in the range of about 1 Torr to about 350 Torr, most preferably in the range of about 1 Torr to about 100 torn. The partial pressure of trisilane is preferably in the range of about 0.0001% to about 100% of the total pressure, more preferably about 0.001% to about 50% of the total pressure. The feed gas can also include a gas or gases other than trisilane, such as other silicon sources or inert carrier gases. Hydrogen and nitrogen are preferred carrier gases for the methods described herein. Preferably, trisilane is introduced to the chamber by way of a bubbler used with a carrier gas to entrain trisilane vapor, more preferably a temperature controlled bubbler.

Preferably, trisilane is introduced to the chamber along with a hydrogen carrier gas, using a relatively high trisilane flow rate and a relatively low hydrogen flow rate, as compared to using silane in place of trisilane. For example, in a preferred embodiment thermal CVD is carried out in an Epsilon E2500™ reactor system (available commercially from ASM America, Inc., of Phoenix, Ariz.) using a trisilane flow rate of about 50 standard cubic centimeters per minute (sccm) or greater (bubbler), more preferably about 100 sccm or greater, even more preferably about 200 sccm or greater, a hydrogen flow rate of about 25 standard liters per minute (slm) or less, more preferably about 20 slm or less, and at a deposition temperature in the range of about 350° C. to about 530° C.

Thermal CVD is preferably conducted at a substrate temperature that is effective to deposit an amorphous Si-containing film over the substrate. Preferably, thermal CVD is conducted at a temperature in the range of about 350° C. to about 530° C., more preferably about 400° C. to about 500° C., most preferably about 425° C. to about 475° C. PECVD is preferably conducted at a temperature in the range of about 0° C. to about 500° C. Those skilled in the art can adjust these temperature ranges to take into account the realities of actual manufacturing, e.g., preservation of thermal budget, deposition rate, etc. The substrate can be heated by a variety of methods known in the art, e.g., resistive heating and lamp heating.

A suitable manifold may be used to supply feed gas(es) to the CVD chamber. In the illustrated embodiments, the gas flow in the CVD chamber is horizontal, most preferably the chamber is a single-wafer, single pass, laminar horizontal gas flow reactor, preferably radiantly heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products (in situ or downstream of a remote plasma generator) to the chamber, but thermal CVD is preferred.

The feed gas may also contain other materials known by those skilled in the art to be useful for doping or alloying Si-containing films, as desired. Preferably the gas further comprises one or more precursors selected from the group consisting of silicon source, germanium source, carbon source, boron source, gallium source, indium source, arsenic source, phosphorous source, antimony source, nitrogen source and oxygen source. Specific examples of such sources include: silane, disilane and tetrasilane as silicon sources; germane, digermane and trigermane as germanium sources; $NF_3$, ammonia, hydrazine and atomic nitrogen as nitrogen sources; various hydrocarbons, e.g., methane, ethane, propane, etc. as carbon sources; monosilylmethane, disilylmethane, trisilylmethane, and tetrasilylmethane as sources of both carbon and silicon; $N_2O$ and $NO_2$ as sources of both nitrogen and oxygen; and various dopant precursors as sources of dopants such as antimony, arsenic, boron, gallium, indium and phosphorous.

Incorporation of dopants into Si-containing films by CVD using trisilane is preferably accomplished by in situ doping using dopant precursors. Precursors for electrical dopants include diborane, deuterated diborane, phosphine, arsenic vapor, and arsine. Silylphosphines $[(H_3Si)_{3-x}PR_x]$ and silylarsines $[(H_3Si)_{3-x}AsR_x]$ where x=0-2 and $R_x$=H and/or D are preferred precursors for phosphorous and arsenic dopants. $SbH_3$ and trimethylindium are preferred sources of antimony and indium, respectively. Such dopant precursors are useful for the preparation of preferred films as described below, preferably boron-, phosphorous-, antimony-, indium-, and arsenic-doped silicon, SiC, SiGe and SiGeC films and alloys. As used herein, "SiC", "SiGe", and "SiGeC" represent materials that contain the indicated elements in various proportions. For example, "SiGe" is a material that comprises silicon, germanium and, optionally, other elements, e.g., dopants. "SiC", "SiGe", and "SiGeC" are not stoichiometric chemical formulas per se and thus are not limited to materials that contain particular ratios of the indicated elements.

The amount of dopant precursor in the feed gas may be adjusted to provide the desired level of dopant in the Si-containing film. Typical concentrations in the feed gas can be in the range of about 1 part per billion (ppb) to about 1% by weight based on total feed gas weight, although higher or lower amounts are sometimes preferred in order to achieve the desired property in the resulting film. In the preferred Epsilon™ series of single wafer reactors, dilute mixtures of dopant precursor in a carrier gas can be delivered to the reactor via a mass flow controller with set points ranging from about 10 to about 200 standard cubic centimeters per minute (sccm), depending on desired dopant concentration and dopant gas concentration. The dilute mixture is preferably further diluted by mixing with trisilane and any suitable carrier gas. Since typical total flow rates for deposition in the preferred Epsilon™ series reactors often range from about 20 standard liters per minute (slm) to about 180 slm, the concentration of the dopant precursor used in such a method is generally small relative to total flow.

Using conventional silicon sources such as silane, it has been found that crystalline films can be formed by depositing amorphous films at relatively low temperatures, then annealing the amorphous films to form crystalline films. This process conserves thermal budget and is often faster than depositing a crystalline film directly at higher temperatures. However, attempts to increase the overall rate of crystalline film formation have been frustrated by the relatively slow deposition rate of the amorphous film using conventional silicon sources at low temperatures. In addition, deposition over mixed substrates using such conventional silicon sources is problematic for the reasons discussed above.

Figure 1A:
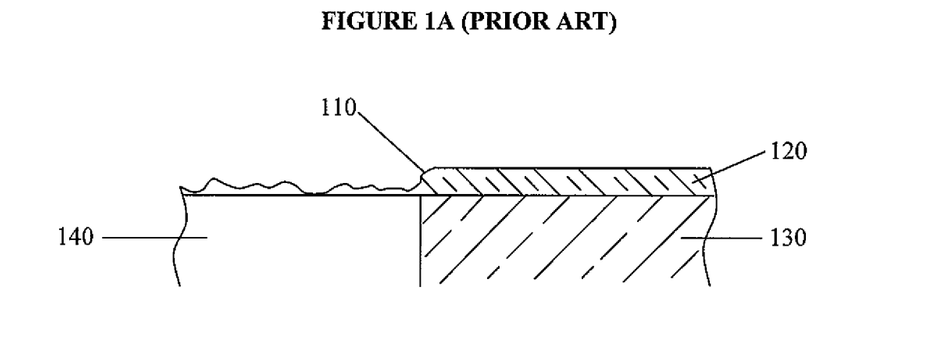
FIGS. 1A and 1B are schematic cross sections of the structures obtained by prior art methods for creating a single crystalline film overlying a mixed substrate.
Figure 1B:
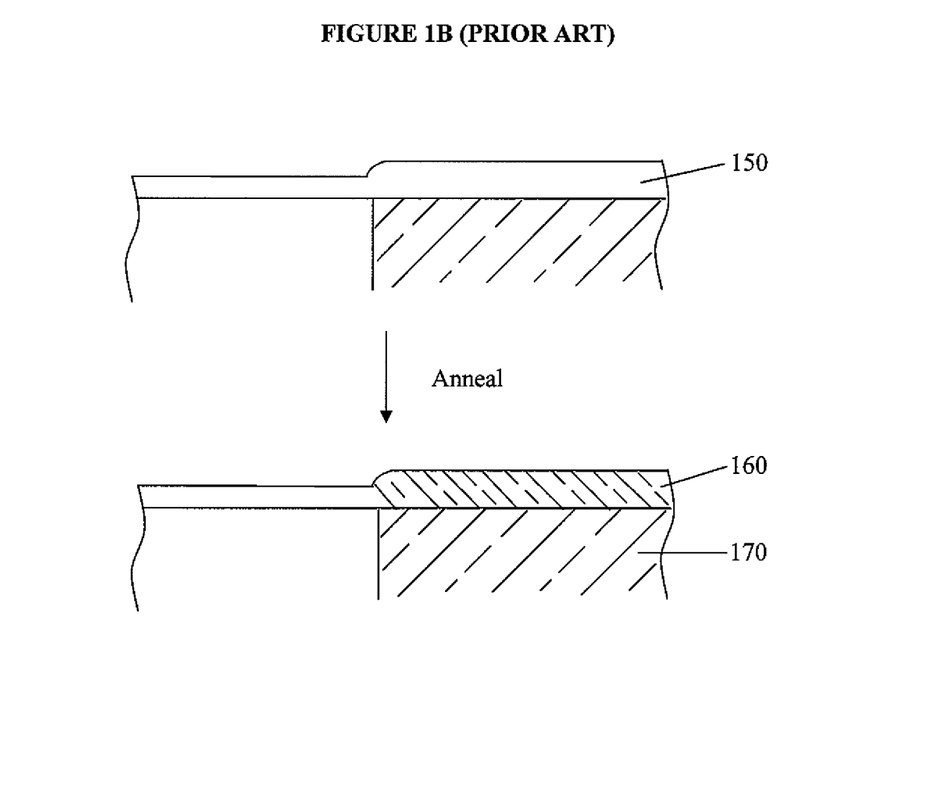

For example, FIGS. 1A and 1B are schematic cross sections of typical structures obtained by prior art methods for creating a single crystal film overlying a mixed substrate. FIG. 1A illustrates a film 110 deposited using silane under deposition conditions resulting in the formation of a single crystal film 120 over the single crystal portion 130 of the mixed substrate. It is apparent from FIG. 1A that the thickness of the deposited film is not uniform, because the nucleation rate of silane on the dielectric portion 140 of the underlying mixed substrate differs considerably from the nucleation rate on the single crystal portion 130. FIG. 1B illustrates a film deposited using silane under conditions resulting in the formation of an amorphous film 150 over a mixed substrate, followed by annealing to form a single crystalline film 160 over the single crystal portion 170 of the mixed substrate. It is apparent that thickness uniformity is improved somewhat relative to FIG. 1A (because the deposition of amorphous films is less sensitive to the morphology of the substrate), but nevertheless remains a problem.

Figure 2:
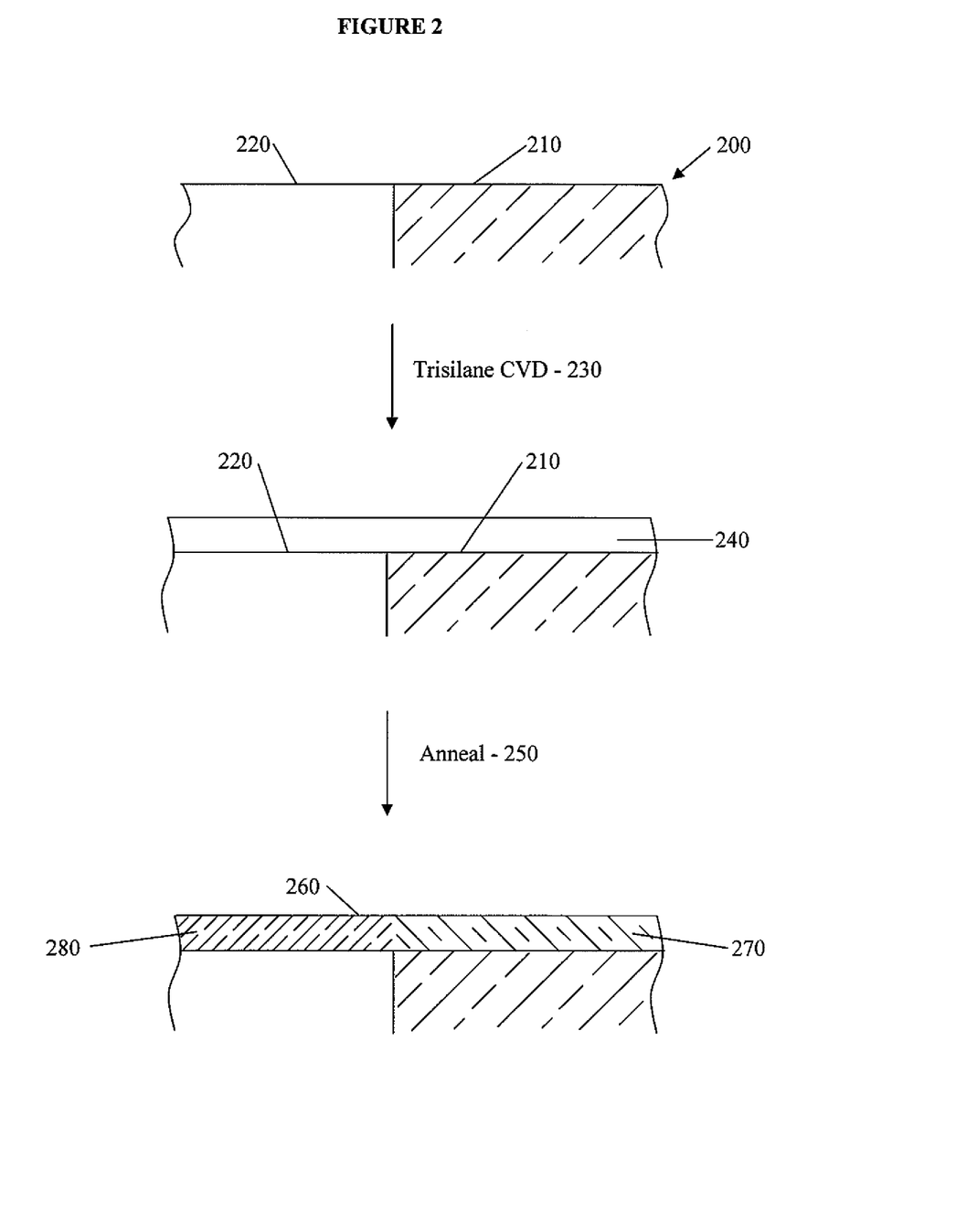
FIG. 2 schematically illustrates a process for depositing an amorphous Si-containing film over a mixed substrate using trisilane, then annealing to form a single crystal region over the underlying single crystal surface and a polycrystalline region over the underlying dielectric surface.

Reference is now made to FIGS. 2-5 and to various aspects of the preferred embodiments illustrated therein. FIG. 2 schematically illustrates the deposition of an amorphous Si-containing film over a mixed substrate using trisilane, followed by annealing to form a film having both single crystal and polycrystalline regions. As used herein, the term "annealing" means subjecting a Si-containing material to a thermal treatment that alters its degree of crystalline order. A mixed substrate 200 having a single crystal surface 210 and a dielectric surface 220 is exposed to trisilane CVD conditions 230 to deposit an amorphous Si-containing film 240 over both the surfaces 210 and 220. Preferred trisilane deposition conditions involve introducing trisilane to a deposition chamber (not shown) having the mixed substrate 200 disposed therein, preferably at a deposition temperature in the range of about 350° C. to about 530° C., more preferably about 400° C. to about 500° C., most preferably about 425° C. to about 475° C., for a period of time that is effective to produce an amorphous Si-containing film having the desired thickness. Trisilane is preferably delivered in the form of a feed gas to the chamber via a temperature controlled bubbler at a flow rate of about 50 sccm or greater, preferably in admixture with a carrier gas. The feed gas may also contain other materials known by those skilled in the art to be useful for doping or alloying Si-containing films, as discussed above. In preferred embodiments, the Si-containing film is silicon, doped silicon, SiGe, or doped SiGe. The amorphous film 240 is very uniform, as discussed below with respect to Table 1. The amorphous film 240 is then annealed 250 at a temperature or temperatures in the range of about 500° C. to about 1100° C. to produce a mixed morphology crystalline film 260 having a single crystal region 270 over the single crystal surface 210 and a polycrystalline region 280 over the dielectric surface 220. Within the range of about 500° C. to about 1100° C., annealing at lower temperatures tends to be slower and also tends to increase epitaxial lateral overgrowth (ELO) of the single crystal region 270 over the dielectric surface 220, minimizing the polycrystalline region 280, whereas annealing at higher temperatures tends to be faster and also minimizes ELO. However, annealing at higher temperatures also tends to consume thermal budget. Preferably, annealing is conducted at a temperature or temperatures in the range of about 530° C. to about 750° C., more preferably about 550° C. to about 700° C., even more preferably about 575° C. to about 650° C., for a period of time that is effective to crystallize the amorphous film to the extent desired. Partial crystallization results in a film that comprises a mixture of amorphous and crystalline material.

Figure 3:
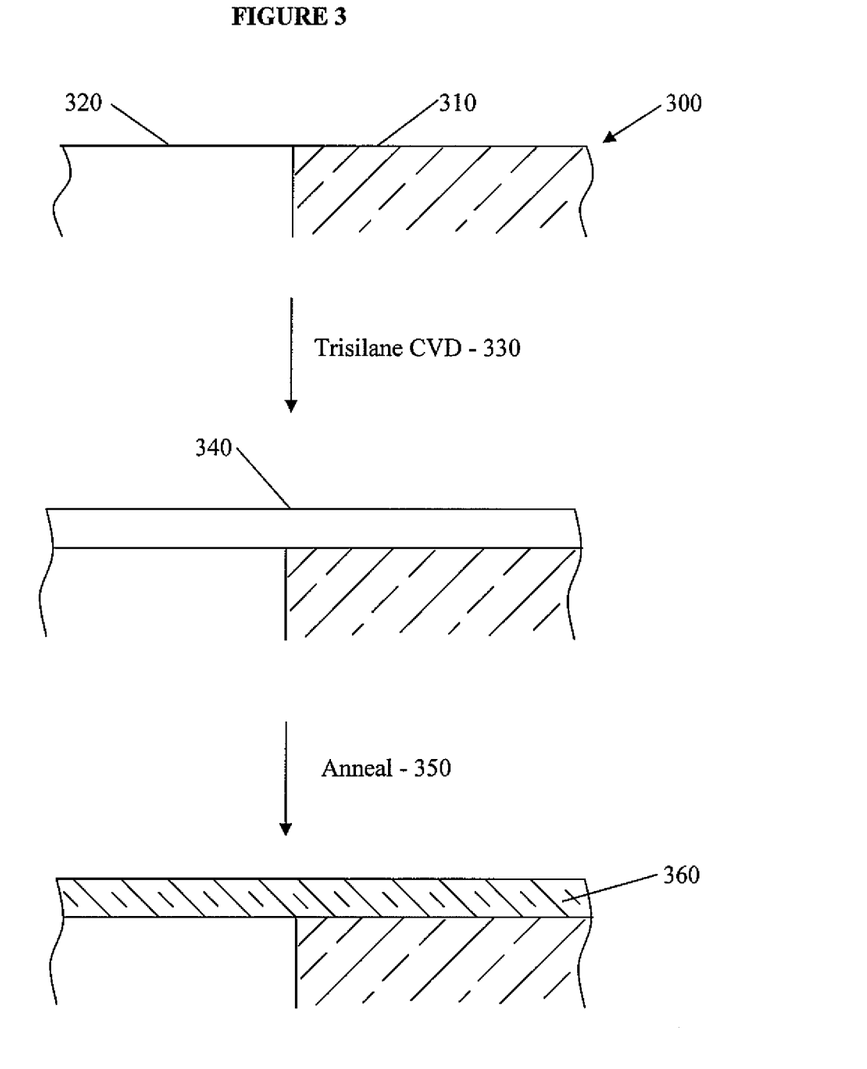
FIG. 3 schematically illustrates a process for depositing an amorphous Si-containing film over a mixed substrate using trisilane, then annealing to form a single crystal region over the underlying single crystal surface and over the underlying dielectric surface.

FIG. 3 schematically illustrates the deposition of an amorphous film over a mixed substrate using trisilane, followed by annealing to form a film having a single crystal region that extends over both of the underlying surfaces. A mixed substrate 300 having a single crystal semiconductor surface 310 and a dielectric surface 320 is exposed to trisilane CVD conditions 330 to deposit an amorphous Si-containing film 340 over both the surfaces 310 and 320. Trisilane CVD conditions 330 are generally similar to trisilane CVD conditions 230 described above. The amorphous Si-containing film 340 is very uniform, as discussed below with respect to Table 1. The amorphous film 340 is then annealed 350 at a temperature or temperatures in the range of about 500° C. to about 750° C. to produce a crystalline film 360 having a single crystal morphology over both the single crystal surface 310 and the dielectric surface 320. Annealing at temperatures closer to 700° C. tends to be faster, but also tends to decrease the extent of ELO of the single crystal region 360 over the dielectric surface 320, as the annealing conditions approach those illustrated in FIG. 2. Annealing at temperatures closer to 500° C. tends to be slower, but also tends to favor ELO and decrease the formation of polycrystalline material over the dielectric surface 320. Preferably, annealing is conducted at a temperature or temperatures in the range of about 500° C. to about 700° C., more preferably about 530° C. to about 675° C., even more preferably about 550° C. to about 625° C., for a period of time that is effective to crystallize the amorphous film to the extent desired. Partial crystallization results in a film that comprises a mixture of amorphous and crystalline material.

Figure 4:
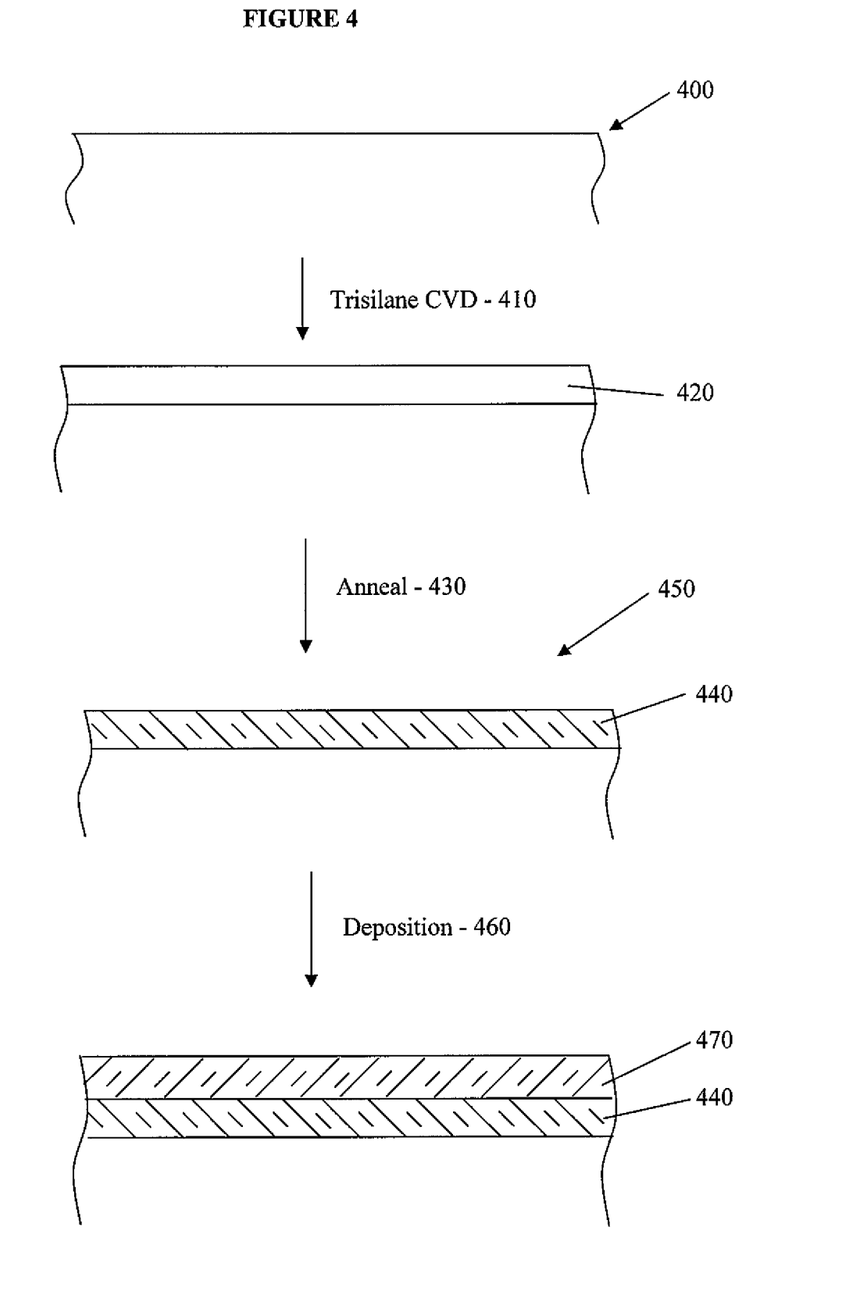
FIG. 4 schematically illustrates a process for depositing an amorphous Si-containing film over a dielectric substrate using trisilane, annealing to form a single crystal region over the underlying dielectric surface, then depositing a single crystal film over the single crystal region.

It is apparent from the foregoing that the methods described herein may be used to deposit amorphous Si-containing films over single morphology substrates. For example, FIG. 4 schematically illustrates the deposition of an amorphous film over an oxide substrate using trisilane. An oxide substrate 400 is exposed to trisilane CVD conditions 410 to deposit an amorphous Si-containing film 420 thereon. Trisilane CVD conditions 410 are generally similar to trisilane CVD conditions 230 described above. The amorphous film 420 may then be annealed 430 at a temperature or temperatures in the range of about 500° C. to about 1100° C. to produce a single crystal film 440. The resulting structure 450 is a silicon-on-oxide (SOI) structure that is useful in a number of applications as described below. Annealing at temperatures closer to 500° C. tends to be slower, but consumes less thermal budget. Preferably, annealing is conducted at a temperature or temperatures in the range of about 500° C. to about 750° C., more preferably about 530° C. to about 700° C., even more preferably about 550° C. to about 650° C., for a period of time that is effective to crystallize the amorphous film to the extent desired. Partial crystallization results in a film that comprises a mixture of amorphous and crystalline material.

The SOI structure 450 is a preferred embodiment useful in a number of applications. For example, FIG. 4 illustrates a process in which the structure 450 serves as a substrate for a deposition step 460 that results in an single crystal SiGe film 470 overlying single crystal film 440. The deposition step 460 may be conducted by any method known to those skilled in the art for depositing single crystal SiGe films over single crystal substrates, but is preferably conducted using trisilane as the silicon source. For a single crystal film 470 having a Ge content of about 30% or less, the deposition step 460 may be conducted by directly depositing the single crystal SiGe film 470 onto the single crystal film 440, optionally after preparing the epitaxial film 440 for deposition using an HF last clean and/or bake step. For a single crystal film 470 having a Ge content of about 60% or less, and particularly when the Ge content is about 30% or greater, the deposition step 460 is preferably conducted in the general manner described below with respect to FIG. 5 for depositing the single crystal film 540 onto the single crystal substrate 500.

Figure 5:
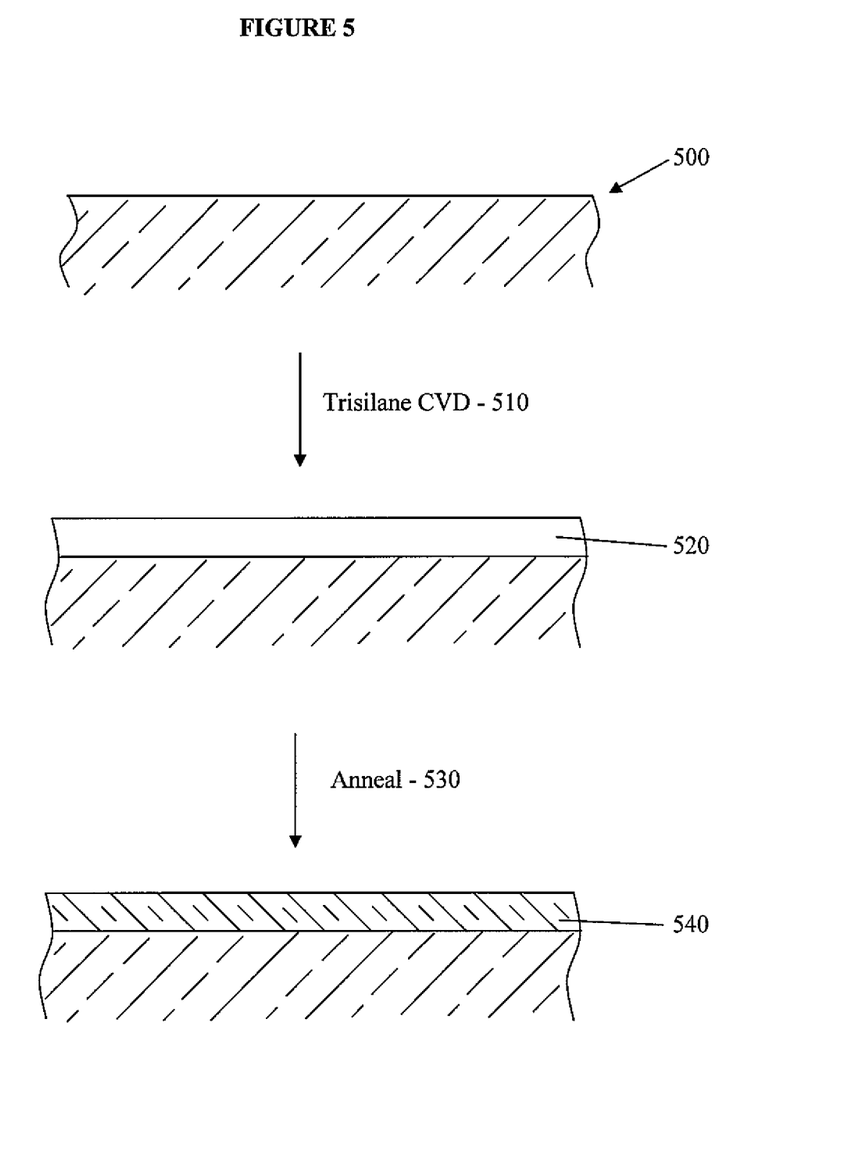
FIG. 5 schematically illustrates a process for depositing an amorphous Si-containing film over a single crystal substrate using trisilane, then annealing to form a single crystal region over the underlying single crystal surface.

FIG. 5 schematically illustrates the deposition of an amorphous film over a single crystal substrate using trisilane. A single crystal substrate 500 is exposed to trisilane CVD conditions 510 to deposit an amorphous Si-containing film 520 thereon. Trisilane CVD conditions 510 are generally similar to trisilane CVD conditions 230 described above. The amorphous film 520 may then be annealed 530 at a temperature or temperatures in the range of about 500° C. to about 1100° C. to produce a single crystal film 540. Annealing at temperatures closer to 500° C. tends to be slower, but also tends to produce single crystal films having fewer faults and consumes less thermal budget. Preferably, annealing is conducted at a temperature or temperatures in the range of about 500° C. to about 750° C., more preferably about 530° C. to about 700° C., even more preferably about 550° C. to about 650° C., for a period of time that is effective to crystallize the amorphous film to the extent desired. Partial crystallization results in a film that comprises a mixture of amorphous and crystalline material.

It has now been found that the deposition of amorphous Si-containing films using trisilane can offer significant advantages over the use of conventional silicon sources when conducted as described herein. For example, at a given deposition temperature, deposition of Si-containing films using trisilane preferably proceeds at a rate that is significantly faster than when silane is used instead of trisilane. Deposition of the amorphous Si-containing films described herein is preferably conducted at a rate of about 5 Å per minute or higher, more preferably about 10 Å per minute or higher, most preferably about 20 Å per minute or higher. A preferred embodiment provides a high rate deposition method in which trisilane is delivered to the substrate surface at a delivery rate of at least about 0.001 milligram per minute per square centimeter of the substrate surface, more preferably at least about 0.003 milligram per minute per square centimeter of the substrate surface. Under thermal CVD conditions, preferably at a deposition temperature in the range of about 425° C. to about 525° C., practice of this embodiment results in relatively fast deposition of the Si-containing material (as compared to other silicon sources), preferably at a rate of about 10 Å per minute or higher, more preferably about 25 Å per minute or higher, most preferably about 50 Å per minute or higher. Preferably, a germanium source is also delivered to the surface along with the trisilane to thereby deposit a SiGe-containing material as the Si-containing material.

Preferred amorphous Si-containing films have a thickness that is highly uniform across the surface of the film. When deposition is conducted using trisilane over uniform or mixed substrates as described herein, the percent thickness non-uniformity for the resulting amorphous films is preferably about 20% or less. Depending on the mean thickness of the film, additional values for percent thickness non-uniformity may be preferred as shown in Table 1 below. Each value for % thickness non-uniformity shown in Table 1 is to be understood as if preceded by the word "about."

TABLE 1

| Mean Film Thickness, Å | Preferred Range of % Thickness Non-Uniformity | More Preferred Range of % Thickness Non-Uniformity | Most Preferred Range of % Thickness Non-Uniformity |
| --- | --- | --- | --- |
| >150 Å | <10 | <8 | <4 |
| 100-150 | <10 | <8 | <6 |
| 50-99 | <15 | <10 | <8 |
| <50 | <20 | <15 | <10 |

In general, measurements of film thickness uniformity for a film deposited under a particular set of process conditions can be made by depositing the film on a uniform or mixed substrate having a diameter in the range of about 200 mm to about 300 mm. Film thickness uniformity is determined by making multiple-point thickness measurements along a randomly selected diameter (with no measurements being taken within a 3 mm exclusion zone at the wafer periphery), determining the mean thickness by averaging the various thickness measurements, and determining the root mean square (rms) variability. A preferred instrument for measuring film thickness utilizes a Nanospec® 8300×SE instrument (commercially available from Nanometrics, Inc., Sunnyvale, Calif.), and a preferred measurement method involves using such an instrument to measure the film thickness at 49 points along a randomly selected wafer diameter. In practice, thickness variability is typically obtained directly from the instrument following such a measurement, and thus need not be calculated manually. To enable comparisons, the results can be expressed as percent non-uniformity, calculated by dividing the rms thickness variability by the mean thickness and multiplying by 100 to express the result as a percentage. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein.

Preferably, one or more of the various advantages realized by depositing the amorphous Si-containing film using trisilane produces one or more corresponding advantages when annealed to form a crystalline film as described herein. In a particular case, the annealing temperature or temperature range is preferably selected by considering factors such as the desired degree and type of crystallinity, the rate of production, and/or the thermal budget for the process, and is typically in the range of about 500° C. to about 1100° C., preferably in the range of about 530° C. to about 750° C., and more preferably about 525° C. to about 650° C. The degree of crystalline order achieved by annealing may be affected by the time, temperature and pressure during annealing, and by the thickness of the amorphous film. For example, the rate of annealing is generally faster at higher temperatures and at lower pressures. Longer annealing times and/or lower pressures tend to produce higher degrees of crystallinity. Thinner amorphous films tend to crystallize more quickly and to a greater extent than thicker films. The temperature and/or the pressure may be held constant or varied over the course of annealing.

The use of trisilane as described herein to deposit amorphous Si-containing films enables the efficient production of a variety of crystalline films by annealing the deposited films. For example, if desired, the overall production rate of a crystalline film may be materially increased by using trisilane to deposit the precursor amorphous film more quickly; a crystalline film having a mixed morphology can be produced by using trisilane to deposit the amorphous precursor film over a mixed substrate; and/or the thickness uniformity of a crystalline film may be improved by using trisilane to deposit a correspondingly uniform amorphous precursor film. Thus, for example, the percent thickness non-uniformity for the resulting crystalline films is preferably about 20% or less. Depending on the mean thickness of the crystalline film, additional values for percent thickness non-uniformity may be preferred as shown in Table 1 above.

In addition, the compositional uniformity of preferred crystalline Si-containing films that contain other elements (e.g., doped silicon, Si-containing alloys, and doped Si-containing alloys) made in accordance with the methods described herein, e.g., depositing an amorphous film using trisilane and a source of the other element, then annealing to crystallize, is materially improved as compared to corresponding films made without the use of trisilane. This invention is not bound by any theory of operation, but it is believed that the amorphous Si-containing films have a degree of compositional uniformity that is better than corresponding as-deposited crystalline Si-containing films, and that this degree of compositional uniformity is substantially preserved when the amorphous films are annealed. Furthermore, crystalline Si-containing alloys containing relatively high levels of non-silicon element(s) can be prepared by the methods described herein. For example, crystalline SiGe preferably contains about 10 atomic % Ge or greater, more preferably about 20 atomic % Ge or greater, even more preferably about 30 atomic % Ge or greater.

Thus, preferred embodiments provide improved crystalline Si-containing films by using trisilane to deposit an amorphous precursor film, then annealing the precursor film by, e.g., SPE or ELO to form a crystalline film. The ability to deposit precursor amorphous films quickly and with a high degree of uniformity, even when the films are thin and even over mixed substrates, enables corresponding improvements in the production and quality of the resulting crystalline films. The use of trisilane is especially useful in SPE and ELO processes, as compared to the use of conventional silicon sources, because it enables the processes to be conducted faster and/or results in the production of higher quality crystalline films.

In a preferred embodiment, a relatively thick, high quality Si-containing epitaxial film is formed over a mixed substrate by first depositing a thin amorphous Si-containing film over the mixed substrate, annealing the amorphous film to form a thin epitaxial film over both of the underlying surfaces, then depositing additional epitaxial material onto the thin epitaxial film, preferably using the thin epitaxial film as a nucleation layer. Preferably, the thin amorphous film has an average thickness of about 300 Å or less, more preferably about 100 Å or less, most preferably about 50 Å or less. Thin films tend to crystallize more readily than thicker films. Annealing is preferably conducted under conditions that favor ELO as discussed above, more preferably in the temperature range of from about 530° C. to about 675° C. and at a pressure of about 100 torr or less. Preferably, annealing results in a thin, uniform epitaxial layer over both of the underlying surfaces of the mixed substrate. This thin epitaxial layer preferably serves as a nucleation layer for the subsequent deposition of an overlying epitaxial film. Such subsequent deposition may be conducted by methods generally known to those skilled in the art, or by deposition using trisilane under conditions that favor the deposition of epitaxial Si-containing materials (e.g., higher temperatures and/or lower pressures than used to deposit amorphous Si-containing films). The resulting total epitaxial film thickness is preferably in the range of about 100 Å to about 10,000 Å.

Example 1

This example illustrates the deposition of amorphous silicon films over mixed morphology substrates.

An eight-inch oxide patterned Si<100> wafer substrate (having both single crystal surfaces and dielectric surfaces) is cleaned and etched using SC1, SC2 and HF-last solutions. The substrate is then loaded into a loadlock of an Epsilon E2500™ reactor system and cycle purged under an ultra-high purity nitrogen atmosphere until the oxygen and moisture partial pressures are significantly reduced below those of the ambient air outside the reactor system. The substrate is then introduced into the reactor system at 400° C., the pressure is reduced to 40 Torr at a hydrogen flow rate of 5 slm, and the substrate is allowed to stabilize for 20 seconds. The hydrogen flow is then increased to 10 slm as the temperature of the substrate is raised to 450° C. The substrate is then allowed to stabilize for 10 seconds, after which time a flow of 400 sccm (hydrogen bubbler) of trisilane is introduced for 45 seconds. A continuous, uniform amorphous silicon film having a thickness of about 50 Å is deposited over both the single crystal and oxide surfaces. The substrate is then removed from the reactor and returned to the loadlock.

Example 2

This example illustrates annealing an amorphous silicon film over a mixed substrate to yield a crystalline film having a single crystal region and a smooth, continuous polycrystalline region.

A 50 Å amorphous silicon film is deposited onto a mixed morphology substrate by the method described in Example 1. The film is then annealed within the reactor at 625° C. for 5 minutes at a pressure of 100 Torr under a flow of 30 slm hydrogen gas. This results in the conversion of the amorphous silicon film to a crystalline film having single crystal regions over the single crystal surfaces and having smooth polysilicon regions over the dielectric surfaces.

Example 3

This example illustrates annealing an overlying amorphous silicon film to produce a crystalline film having single crystal regions over underlying crystal Si<100> surfaces by solid phase epitaxy (SPE) and single crystal regions over underlying dielectric SiO$_2$ surfaces by ELO (also know as Lateral Solid Phase Epitaxy (LSPE)).

A 150-Å amorphous silicon film is deposited onto a mixed morphology substrate by the method described in Example 1. The film is then annealed at 575° C. for 10 minutes at atmospheric pressure under a flow of 30 slm argon carrier gas. This results in the conversion of the amorphous silicon film to a single crystal film over the underlying single crystal surfaces (by SPE) and over the underlying dielectric surfaces (by ELO).

All patents, patent applications and papers mentioned herein are hereby incorporated by reference in their entireties. It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A deposition method comprising:
   depositing an amorphous Si-containing film onto an exposed single crystal surface of a mixed substrate at a rate of about 20 Å per minute or higher using a feed gas that comprises trisilane, wherein the amorphous Si-containing film has a thickness non-uniformity that is about 20% or less across its surface over the mixed substrate; and
   annealing the amorphous Si-containing film to form a crystalline Si-containing film that comprises a single crystal region.

2. The method of claim 1 in which the crystalline Si-containing film is an epitaxial crystalline film.

3. The method of claim 1 in which the crystalline Si-containing film further comprises a polycrystalline region.

4. The method of claim 1 in which the depositing is conducted at a temperature in the range of about 350° C. to about 500° C.

5. The method of claim 1 in which the annealing is conducted at a temperature in the range of about 500° C. to about 1100° C.

6. The method of claim 1 in which the depositing is conducted at a temperature in the range of about 350° C. to about 500° C. and the annealing is conducted at a temperature in the range of about 500° C. to about 750° C.

7. The method of claim 6 in which the substrate is crystalline.

8. The method of claim 1 in which the crystalline Si-containing film is selected from the group consisting of silicon, doped silicon, SiC, doped SiC, SiGe, doped SiGe, SiGeC, and doped SiGeC.

9. The method of claim 1, further comprising depositing a SiGe film onto the crystalline Si-containing film.

10. The method of claim 9 in which the SiGe film comprises a dopant.

11. The method of claim 1 in which the feed gas further comprises a precursor selected from the group consisting of a germanium source, a silicon source, a carbon source, a boron source, a gallium source, an indium source, an arsenic source, a phosphorous source, an antimony source, a nitrogen source and an oxygen source.

12. The method of claim 11 in which the precursor is a silicon source selected from the group consisting of silane and disilane.

13. The method of claim 1, wherein the mixed substrate comprises the single crystal surface and a surface that is not single crystal.

14. The method of claim 1, wherein the mixed substrate comprises a surface that is epitaxial and a surface that is not epitaxial.

15. The method of claim 1, wherein the mixed substrate comprises a surface that is amorphous and a surface that is not amorphous.

16. The method of claim 1, wherein the thickness non-uniformity is about 15% or less.

17. The method of claim 1, wherein thickness non-uniformity is about 10% or less.

18. The method of claim 1, wherein the thickness non-uniformity is about 8% or less.

19. The method of claim 1, wherein the thickness non-uniformity is about 6% or less.

20. The method of claim 1, wherein the thickness non-uniformity is about 4% or less.

21. The method of claim 1, wherein the rate is about 50 Å per minute or higher.

22. The method of claim 1, wherein the depositing occurs in a chamber, and the chamber comprises a total pressure in the range of about 1 Torr to about 350 Torr.

23. The method of claim 1, wherein the depositing occurs in a chamber, and the chamber comprises a total pressure in the range of about 1 Torr to about 100 Torr.

24. The method of claim 22, wherein trisilane comprises a partial pressure in the range of about 0.0001% to about 100% of the total pressure in the chamber.

25. The method of claim 22, wherein trisilane comprises a partial pressure in the range of about 0.001% to about 50% of the total pressure in the chamber.

* * * * *